United States Patent
Ino

(10) Patent No.: US 8,659,151 B2
(45) Date of Patent: Feb. 25, 2014

(54) SEMICONDUCTOR DEVICE AND MANUFACTURING METHOD THEREOF

(75) Inventor: Yoshihiko Ino, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 352 days.

(21) Appl. No.: 12/153,401

(22) Filed: May 19, 2008

(65) Prior Publication Data

US 2008/0315415 A1 Dec. 25, 2008

(30) Foreign Application Priority Data

Jun. 22, 2007 (JP) ................................. 2007-165488

(51) Int. Cl.
*H01L 31/0236* (2006.01)

(52) U.S. Cl.
USPC .................. 257/737; 257/686; 257/E25.109; 257/E31.124

(58) Field of Classification Search
USPC .......... 257/678, E25.109, E31.124, 685–787, 257/E21.589, E23.021, E21.508, E31.13, 257/E21.02; 438/106, 109, 112, 121, 124, 438/127
See application file for complete search history.

(56) References Cited

U.S. PATENT DOCUMENTS

| | | | | |
|---|---|---|---|---|
| 5,222,014 | A * | 6/1993 | Lin .............................. | 361/792 |
| 6,010,769 | A * | 1/2000 | Sasaoka et al. ............... | 428/209 |
| 6,222,246 | B1 * | 4/2001 | Mak et al. ..................... | 257/532 |
| 7,276,784 | B2 | 10/2007 | Omizo et al. | |
| 7,547,975 | B2 * | 6/2009 | Takaya et al. ................. | 257/778 |
| 7,807,499 | B2 * | 10/2010 | Nishizawa .................... | 438/107 |
| 2001/0049187 | A1 * | 12/2001 | Enomoto et al. ............. | 438/618 |

(Continued)

FOREIGN PATENT DOCUMENTS

| JP | H09-115912 | 5/1997 |
|---|---|---|
| JP | 11-260999 | 9/1999 |

(Continued)

OTHER PUBLICATIONS

Japanese Office Action dated Feb. 14, 2012, issued in connection with the corresponding Japanese Patent Application No. 2007-165488.

Japanese Office Action dated May 7, 2013, issued in connection with the corresponding Japanese Patent Application No. 2012-090912.

*Primary Examiner* — Cuong Q Nguyen
*Assistant Examiner* — Yosef Gebreyesus
(74) *Attorney, Agent, or Firm* — Rabin & Berdo, PC

(57) ABSTRACT

The present invention provides a double-sided electrode package of a structure excellent in the reliability of connection and moisture resistance to another package, which is capable of being manufactured simply and at low cost. The present invention also provides a double-sided electrode package of a structure capable of forming inner wirings (electrode pads) in arbitrary layouts according to the number of pins of a semiconductor chip and the size thereof, which package is capable of being manufactured simply and at low cost. A copper foil is attached onto a core material formed with electrode pads, wirings, through electrodes, lands and a solder resist. The copper foil is wet-etched in several stages to form surface side terminals which stand on the wirings approximately vertically and each of which includes a plurality of protrusions (convex portions continuous in the circumferential direction) formed at their side faces over the full circumference along the circumferential direction. The peripheries of the surface side terminals are sealed with a sealing resin, and the end faces of the surface side terminals are exposed from a sealing resin layer, whereby redistribution wiring is performed at the surface of the sealing resin layer.

6 Claims, 14 Drawing Sheets

(56) References Cited

U.S. PATENT DOCUMENTS

| | | | |
|---|---|---|---|
| 2003/0138993 A1* | 7/2003 | Nakamura et al. | 438/107 |
| 2004/0160751 A1* | 8/2004 | Inagaki et al. | 361/763 |
| 2004/0198057 A1* | 10/2004 | Huang et al. | 438/694 |
| 2006/0022332 A1* | 2/2006 | Koyama et al. | 257/723 |
| 2007/0292989 A1* | 12/2007 | Omizo et al. | 438/109 |
| 2009/0008765 A1* | 1/2009 | Yamano et al. | 257/690 |
| 2009/0219719 A1* | 9/2009 | Hsu et al. | 362/249.02 |

FOREIGN PATENT DOCUMENTS

| | | |
|---|---|---|
| JP | 2000-183283 | 6/2000 |
| JP | 2003-318534 | 11/2003 |
| JP | 2006-114604 | 4/2006 |
| JP | 2007-335464 | 12/2007 |

* cited by examiner

United States Patent US 8,659,151 B2

SEMICONDUCTOR DEVICE AND MANUFACTURING METHOD THEREOF

BACKGROUND OF THE INVENTION

The present invention relates to a semiconductor device and a manufacturing method thereof, and particularly to a semiconductor device (double-sided electrode package) having a double-sided electrode structure and a manufacturing method thereof.

With miniaturization of electronic equipment such as a cellular phone, the development of three-dimensional package techniques with a higher packaging density has recently been underway. Of the three-dimensional package techniques, a method called "package on package (POP)" in which another package is stacked on one package is promising. In the POP, there has also been proposed laminating of packages extending to a multilayer like three layers or four layers (refer to a patent document 1 (Japanese Unexamined Patent Publication No. He 11(1999)-260999)).

A typical structure of a conventional POP is shown in FIG. 18. Another package 2 is stacked on a package 1 in this POP structure. A semiconductor chip is flip-chip connected in the package 1 located on the lower side. The package 1 is provided with solder balls as connecting terminals on its back side and provided with land portions with solder paste applied thereto on its surface side.

In the package 2 located on the upper side, a semiconductor chip is wire bond-connected and sealed with a resin. Even in the package 2, land portions are provided on its back side as connecting terminals. The land portions of the package 2 are provided at positions opposite to those of the package 1 in a stacked state. The land portions of the package 2 are respectively electrically connected to the land portions of the package 1 by means of solder balls 3.

The conventional POP however involves various problems. They are as follows: for example, (1) since packages are stacked on each other, a mounting height cannot be lowered as compared with the stacking of semiconductor chips, (2) when warpage occurs in each package, the reliability of electrical connections is degraded, (3) since the lower package becomes insufficient in sealing, moisture-resistant reliability is degraded, and (4) since there is a limit to reduce the diameter of each of the solder balls provided in each package as the connecting terminals, the conventional POP is not adaptable to a multi-pin configuration of the semiconductor chip. Any of these problems is attributable to the structures of the laminated packages.

A double-sided electrode package is used in the POP. The double-sided electrode package includes at least inner wirings connected to each semiconductor chip, through electrodes which connect electrodes and inner wirings on the package surface side, and through electrodes which connect electrodes and inner wirings on the package back surface side. In order to solve the problems of the prior art POP, there is a need to develop a double-sided electrode package having a structure excellent in reliability, productivity and general versatility.

SUMMARY OF THE INVENTION

The present invention has been made in view of the above situation. An object of the present invention is to provide a double-sided electrode package capable of being manufactured simply and at low cost and having a structure excellent in the reliability of connection and moisture resistance to other packages. Another object of the present invention is to provide a manufacturing method capable of manufacturing a double-sided electrode package of a structure excellent in the reliability of connection and moisture resistance to other packages simply and at low cost.

A further object of the present invention is to make it possible to manufacture simply and at low cost, a double-sided electrode package of a structure capable of forming inner wirings (electrode pads) in arbitrary layouts according to the number of pins of a semiconductor chip and the size thereof.

In order to attain the above objects, there is provided a semiconductor device of the present invention, comprising a package substrate having electrode pads formed over a surface thereof and respectively electrically connected to electrodes of a semiconductor chip and having external connecting pads formed over a back surface thereof and electrically connected to the electrode pads, the semiconductor chip placed over a surface of the package substrate and having the electrodes respectively electrically connected to the electrode pads, post-like surface side terminals each having a plurality of protrusions formed at a side face thereof over a full circumference thereof along a circumferential direction thereof and having one ends respectively electrically connected to the electrode pads, and a sealing resin layer which seals the semiconductor chip with a sealing resin and surrounds peripheries of the surface side terminals such that the other ends of the surface side terminals are exposed to a surface of the sealing resin layer.

In the semiconductor device of the present invention, the surface side terminals preferably stand vertically to the package substrate. The surface side terminals are preferably cylindrical or conical.

In the surface side terminals, one end sides thereof respectively electrically connected to the electrode pads can be made slender than other end sides exposed to the surface of the sealing resin layer. Alternatively, the surface side terminals may be provided, on the one end sides respectively electrically connected to the electrode pads, with step-like portions that protrude in the direction in which the semiconductor chip is disposed.

The surface side terminals can be formed by etching a metal film laminated over the package substrate plural times in parts. The protrusions at the side faces of the surface side terminals can be formed by side etch at etching.

The semiconductor device of the present invention may further include redistribution wiring pads formed over the surface of the sealing resin layer, and connecting wirings which are formed over the surface of the sealing resin layer and electrically connect the other ends of the surface side terminals and the redistribution wiring pads.

In order to attain the above objects, there is provided a method for manufacturing a semiconductor device, comprising the steps of forming electrode pads respectively electrically connected to electrodes of a semiconductor chip over a surface of each package substrate every package with respect to a frame substrate divided into a plurality of the package substrates and forming external connecting pads respectively electrically connected to the electrode pads over a back surface of the package substrate, stacking a metal film over the frame substrate and forming a first mask of a predetermined pattern at a surface of the metal film in such a manner that a plurality of post-like surface side terminals respectively electrically connected to the electrode pads with one ends thereof being associated with one another are formed, performing first etching using the first mask until the metal film is brought to a predetermined thickness, forming a second mask for protecting a side face of each post-like portion formed by the first etching and performing second etching using the first mask and the second mask until each of the package substrates is exposed, placing the semiconductor chip over the surface of the package substrate every package and electrically connecting the electrodes to the electrode pads respectively, forming a sealing resin layer of the same height as each of the surface side terminals over the frame substrate in such a manner that one end of the surface side terminal is exposed, and sealing each of the semiconductor chips with a sealing resin, and accommodating each of the semiconductor chips every package and scribing the frame substrate formed with the electrode pads, the external connecting pads, the surface side terminals and the sealing resin layer every package thereby to divide the frame substrate into the individual packages.

In the case of the semiconductor device further including the redistribution wiring pads and the connecting wirings, the step of forming redistribution wiring pads over the surface of the sealing resin layer every package and forming connecting wirings for electrically connecting the other ends of the surface side terminals and the redistribution wiring pads respectively is executed before the frame substrate is scribed to divide the same into individual packages. Thereafter, the step of accommodating each of the semiconductor chips every package and scribing the frame substrate formed with the electrode pads, the external connecting pads, the surface side terminals, the sealing resin layer, the redistribution wiring pads and the connecting wirings every package thereby to divide the frame substrate into the individual packages is executed.

In the manufacturing method of the present invention, the first mask formed over the surface of the metal film can be formed of patterns in which a plurality of small circular masks are respectively disposed at positions opposite to the connecting pads connected to the surface side terminals, of the electrode pads.

The second etching is performed on the condition that the second etching becomes greater than the first etching in side etch, thereby to make one end sides electrically connected to the electrode pads, of the surface side terminals more slender than the other end sides exposed to the surface of the sealing resin layer.

A third mask extending in the direction to lay out the semiconductor chip from the second mask is further formed over the surface of a metal film left after the first etching along with the second mask. The second etching is performed using the first mask, the second mask and the third mask until the package substrate is exposed, thereby making it possible to form step-like portions protruding in the direction in which the semiconductor chip is disposed, on one end sides electrically connected to the electrode pads, of the surface side terminals.

According to the present invention, an effect is brought about in that a double-sided electrode package excellent in the reliability of connection and moisture resistance to other packages can be manufactured simply and at low cost. An effect is also brought about in that inner wirings (electrode pads) can be formed in arbitrary layouts according to the number of pins of a semiconductor chip and the size thereof by devising the structure of each post-like surface side terminal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 9 is a view showing a step for sealing the semiconductor chips, wherein FIG. 9(A) is a partly sectional view of the resin-sealed substrate frame, and FIG. 9(B) is a plan view of the resin-sealed substrate frame as viewed from its surface side;

FIG. 12 is a view showing a dicing step, wherein FIG. 12(A) is a partly sectional view of the substrate frame at dicing, and FIG. 12(B) is a plan view of the substrate frame as viewed from its surface side;

DETAILED DESCRIPTION OF THE PREFERRED EMBODIMENTS

Preferred embodiments of the present invention will hereinafter be described in detail with reference to the accompanying drawings.

First Preferred Embodiment

[Double-Sided Electrode Package]

Figure 1:
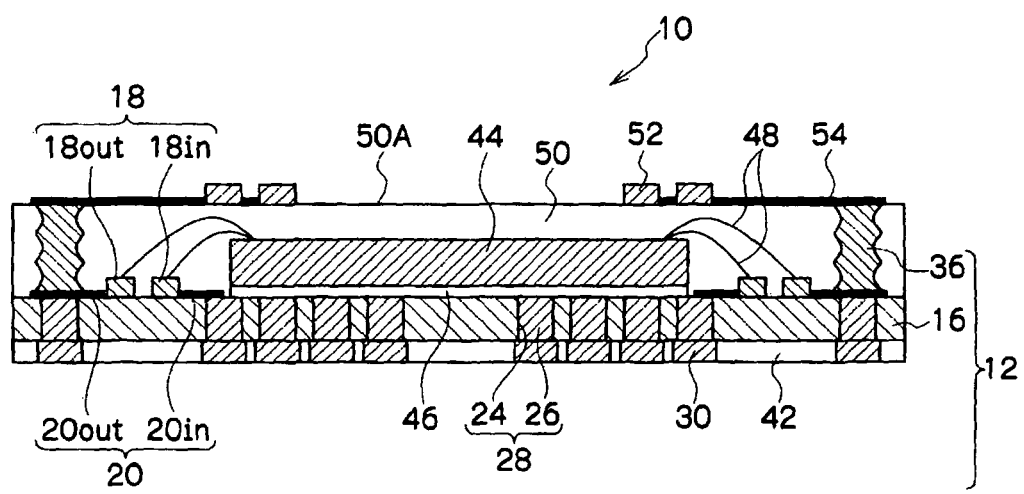
FIG. 1 is a schematic sectional view showing a configuration of a double-sided electrode package according to a first preferred embodiment of the present invention.

FIG. 1 is a schematic sectional view showing a configuration of a double-sided electrode package according to a first preferred embodiment of the present invention. The double-sided electrode package 10 according to the first preferred embodiment includes a flat plate-shaped core material 16 comprised of an insulator such as a resin, ceramic or the like. A plurality of vias 24 that penetrate the core material 16 are formed in the core material 16. A conductive material 26 is charged into the vias 24, thereby resulting in through electrodes 28. One ends of the through electrodes 28 are exposed to the surface of the core material 16, and the other ends thereof are exposed to the back surface of the core material 16.

A plurality of electrode pads 18 for connecting a semiconductor chip 44 such as an LSI chip, a plurality of surface side terminals 36, and a plurality of wirings 20 for electrically connecting the electrode pads 18 and one ends of the through electrodes 28 or one ends of the surface side terminals 36 are formed on the surface of the core material 16 in a predetermined layout. The electrode pads 18 are arranged in two inner and outer rows. Each of the post-like surface side terminals 36 stands on its corresponding wiring 20 formed on the surface of the core material 16, approximately vertically to the core material 16. Incidentally, the electrode pads 18 and the wirings 20 correspond to "electrode pads" of the present invention.

When there is no need to distinguish between the inner and outer electrode pads 18, they are generically called "electrode pads 18" below. On the other hand, when there is a need to distinguish between them, the inner electrode pads 18 are referred to as "inner electrode pads $18_{in}$", and the outer electrode pads 18 are referred to as "outer electrode pads $18_{out}$", respectively.

When there is no need to distinguish between the inner and outer wirings 20, they are also generically called "wirings 20". On the other hand, when there is a need to distinguish between them, the wirings 20 for connecting the inner electrode pads $18_{in}$ and one ends of the through electrodes 28 are called "inner wirings $20_{in}$", and the wirings 20 for connecting the outer electrode pads $18_{out}$ and one ends of the surface side terminals 36 are called "outer wirings $20_{out}$", respectively.

A plurality of lands 30 for external connections are formed on the back surface of the core material 16 so as to cover exposed portions of the through electrodes 28. The other ends of the through electrodes 28 exposed to the back surface of the core material 16 are electrically connected to the lands 30 respectively. The back surface of the core material 16 is covered with a solder resist 42 with the lands 30 left behind as they are.

The core material 16 formed with the above-mentioned electrode pads 18, wirings 20, through electrodes 28, lands 30 and solder resist 42 is of a package substrate 12. The package substrate 12 is rectangular as viewed on the plane. The size thereof is larger than the plane or planar size of the semiconductor chip 44 (refer to FIG. 2(A)). The electrode pads 18, the wirings 20 and the lands 30 are respectively formed on the surface of the core material 16 or the back surface thereof by, for example, applying a conductive material such as solder paste in predetermined patterns. The surface side terminals 36 are formed of a metal such as copper (Cu). The solder resist 42 is formed on the back surface of the core material 16 by application of a heat-resistant resin material, or the like.

The semiconductor chip 44 such as the LSI chip is mounted onto the central part of the package substrate 12. The back surface of the semiconductor chip 44 is bonded to the surface of the package substrate 12 by a die bond material 46. A plurality of unillustrated electrodes are formed on the surface of the semiconductor chip 44. Metal wires 48 such as gold (Au) thin lines are mounted over between these electrodes of the semiconductor chip 44 and the electrode pads 18 in a loop form such that the semiconductor chip 44 is wire-bonded to the package substrate 12. That is, one ends of the metal wires 48 are electrically connected to their corresponding electrodes of the semiconductor chip 44, and the other ends thereof are electrically connected to their corresponding electrode pads 18.

The semiconductor chip 44 is sealed up with a sealing or encapsulating resin layer 50. The sealing resin layer 50 is formed by, for example, mold-shaping a sealing resin such as an epoxy resin. Similarly, the electrode pads 18, the wirings 20 and the metal wires 48 are also sealed up by the sealing resin layer 50. A surface 50A of the sealing resin layer 50 is flush with the surface side terminals 36. Therefore, a plurality of end faces 36A (refer to FIG. 4) of the surface side terminals 36 are exposed to the surface 50A of the sealing resin layer 50. In other words, the surface of the package substrate 12 is covered with the sealing resin layer 50 with the end faces 36A exposed.

A plurality of redistribution wiring pads 52 are formed on the surface 50A of the sealing resin layer 50 as external connecting terminals for connecting to another double-sided electrode packaged laminated on the upper side. Wirings 54 for connecting these redistribution wiring pads 52 and the end faces 36A in a one-to-one relationship are formed on the surface 50A, and redistribution wiring is performed at the surface of the sealing resin layer 50. Incidentally, the surface of the double-sided electrode package 10 may be covered with a solder resist with only the redistribution wiring pads 52 left behind. A package prior to the formation of the redistribution wiring pads 52 and the wirings 54 is called "double-sided electrode package 10A".

Figure 2:
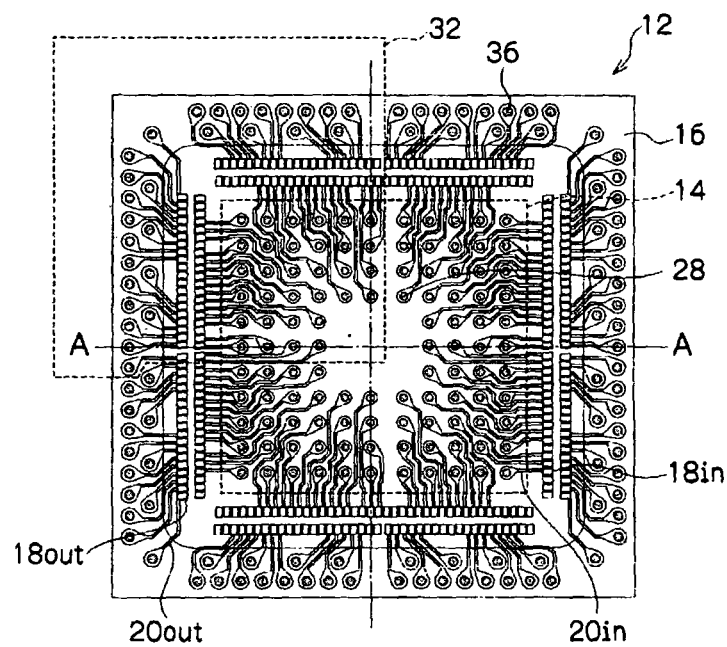
FIG. 2(A) is a plan view of a package substrate formed with surface side terminals as viewed from its surface side.
FIG. 2(B) is a partly plan view showing the manner of an area equivalent to about one-quarter of (A)
Figure 2:
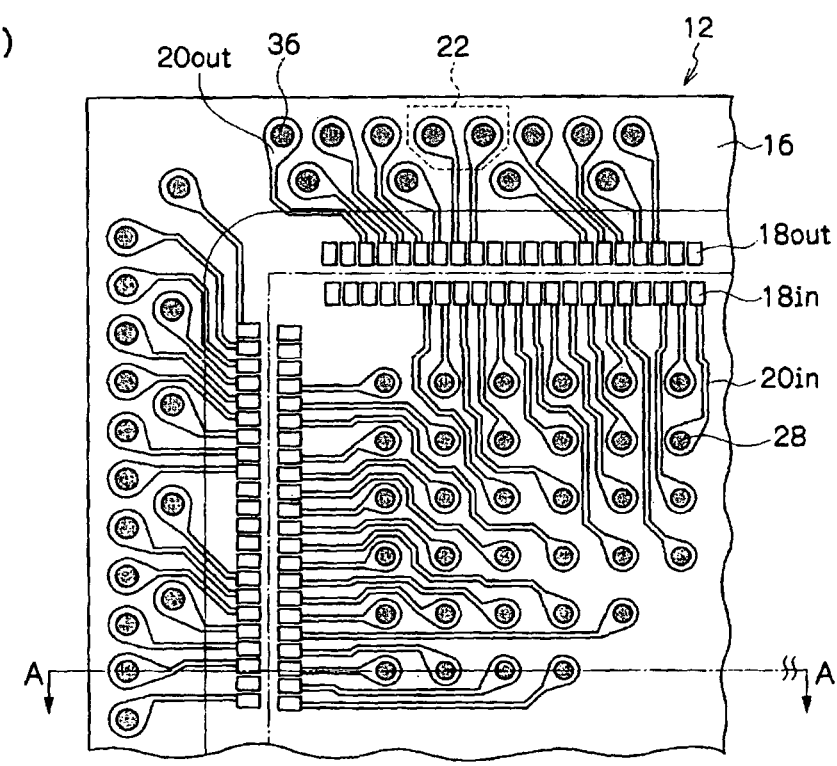

FIG. 2(A) is a plan view of the package substrate 12 prior to the mounting of the semiconductor chip 44 thereon as viewed from its surface side. FIG. 2(B) shows the manner of an area 32 equivalent to about one-quarter of the surface of the rectangular package substrate 12 shown in FIG. 2(A). Incidentally, the size of the package substrate 12 is 13 mm×13 mm in the present embodiment. FIG. 1 corresponds to a sectional view taken along line A-A of FIG. 2.

As shown in FIGS. 2(A) and 2(B), the end faces of the through electrodes 28 are exposed to a chip layout area 14 (area surrounded by a dotted line in FIG. 2(A)) in which the semiconductor chip 44 of the package substrate 12 is disposed. In the present embodiment, 114 through electrodes 28 are arranged at the central part of the package substrate 12 in an 11×11 matrix form except for a few through electrodes located at its center. Further, 106 through electrodes 28 are disposed at the peripheral portion of the package substrate 12 so as to be opposite to the surface side terminals 36 via wirings 20 interposed therebetween.

156 inner electrode pads $18_{in}$ are disposed 39 by 39 for each side outside the chip layout area 14 of the package substrate 12 so as to surround the chip layout area 14 in square form. 160 outer electrode pads $18_{out}$ are disposed 40 by 40 for each side outside the inner electrode pads $18_{in}$ so as to surround the chip layout area 14 in square form. In the present embodiment as described above, the size of the package substrate 12 is 13 mm×13 mm. The inner electrode pads $18_{in}$ are arranged inside a virtual line (one-dot chain line of FIG. 2(B)) located inwardly by about 2 mm from the outer periphery of the package substrate 12 and the outer electrode pads $18_{out}$ are arranged outside the virtual line, with the virtual line interposed between the inner and outer electrodes pads.

Namely, the electrode pads 18 are arranged in two inner and outer rows. As shown in the figure, the inner electrode pads $18_{in}$ and the outer electrode pads $18_{out}$ are arranged in zigzags in such a manner that each of the outer electrode pads $18_{out}$ is opposed to between the two adjacent inner electrode pads $18_{in}$. Thus, the electrode pads 18 are arranged in plural rows and arranged in zigzags to make it easy to perform wiring, thereby making it possible to increase the number of the arranged electrode pads 18.

106 surface side terminals 36 are disposed outside the electrode pads 18 of the package substrate 12 so as to surround the electrode pads 18 and the chip layout area 14 in square form. In the present embodiment as described above, the size of the package substrate 12 is 13 mm×13 mm and the surface side terminals 36 are disposed within a range of about 1.3 mm from the outer periphery of the package substrate 12.

In the present embodiment, 29 or 24 surface side terminals 36 are disposed per side of the rectangular package substrate 12. Within an area in which the 29 surface side terminals 36 are arranged, the surface side terminals 36 are arranged in two rows including 8 surface side terminals inwardly and 21 surface side terminals outwardly. Within an area in which the 24 surface side terminals 36 are arranged, the surface side terminals 36 are arranged in two rows including 8 surface side terminals inwardly and 16 surface side terminals outwardly.

If viewed in part, then the inner surface side terminals 36 are arranged in zigzags so as to be opposed to between the two adjacent outer surface side terminals 36. Arranging the surface side terminals 36 in plural rows and/or in zigzags in a manner similar to the electrode pads 18 makes it easy to perform wiring and enables an increase in the number of the arranged surface side terminals 36.

The inner wirings $20_{in}$ are suitably provided on the surface of the package substrate 12 in predetermined patterns so as to connect one ends of the through electrodes 28 and the inner electrode pads $18_{in}$ in a one-to-one relationship. Further, the outer wirings $20_{out}$ that connect one ends of the surface side terminals 36 and the outer electrode pads $18_{out}$ in a one-to-one relationship are suitably provided thereon in predetermined patterns. In the present embodiment, the 114 inner wirings $20_{in}$ are provided corresponding to the 114 through electrodes 28. The 106 outer wirings $20_{out}$ are provided corresponding to the 106 surface side terminals 36.

Incidentally, FIGS. 2(A) and 2(B) merely illustrate one example of the layout at the package substrate 12. The numbers and layouts of the electrode pads 18, wirings 20, through electrodes 28 and surface side terminals 36 of the package substrate 12 can suitably be changed according to the number of the electrodes (pins) of the semiconductor chip 44, the size of the semiconductor chip 44 and the like. The size of the package substrate 12 can also be changed suitably according to the size of the semiconductor chip 44.

As described in other embodiments of the present invention in particular, the shape of each surface side terminal 36 can be devised and the degree of freedom of the layout is enhanced than conventional. Since the adhesion between the surface side terminals 36 and the sealing resin is good in the present invention as described later, the surface side terminals 36 and the sealing resin layer 50 can be bonded more securely by increasing the number of the surface side terminals 36.

Figure 3:
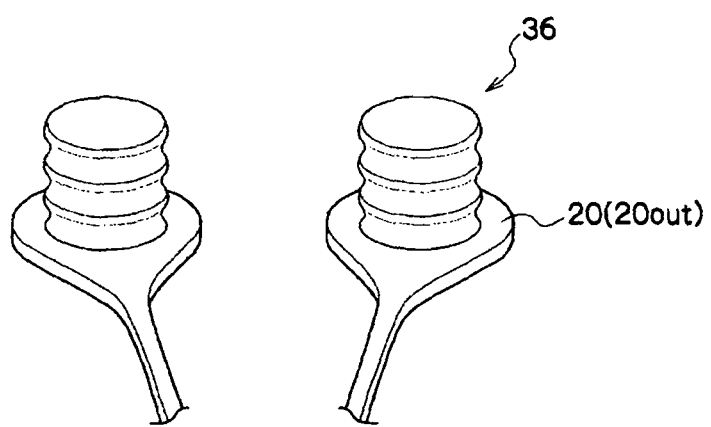
FIG. 3 is a perspective view illustrating the shape of the surface side terminal formed in the first preferred embodiment.

FIG. 3 is a perspective view showing the shape of each surface side terminal 36. FIG. 3 is a perspective view of two surface side terminals 36 existing in an area 22 surrounded by a dotted line of FIG. 2(B) as seen from obliquely upward. The end of each outer wiring 20.sub.out is formed to a drop-shaped pattern one size larger than the section (approximately circular shape) of each surface side terminal 36. As described above, each of the post-like surface side terminals 36 stands on the drop-shaped end of each wiring 20 approximately vertically. Each of the surface side terminals 36 has a plurality of protrusions (convex portions continuous in its circumferential direction) formed at its side over the full circumference along its circumferential direction. Each end portion of each surface side terminal 36 is of a diameter that gradually increases towards an end of the terminal 36 corresponding to the end portion (see FIG. 1).

In the present embodiment, each of the surface side terminals 36 has the three protrusions. With the provision of the plural protrusions, wavy depressions and projections are formed at the side face of each post-like surface side terminal 36. Incidentally, the flat top portion of the surface side terminal 36 is exposed from the sealing resin layer 50 as the end face 36A (refer to FIG. 4) to be described later.

While the periphery of the surface side terminal 36 is buried by the sealing resin, the adhesion thereof to the sealing resin is remarkably enhanced because the surface side terminal 36 is provided with the depressions and projections at its side face. Therefore, the surface side terminals 36 and the sealing resin layer 50 are hard to peel off, and moisture-resistant reliability of the double-sided electrode package 10 is hence enhanced remarkably. The remarkable enhancement of adhesion to the sealing resin means that even though the environmental temperature to which the double-sided electrode package 10 is exposed changes and thereby the metallic surface side terminals 36 expand and contract, the sealing resin layer 50 follows it. Therefore, the possibility of electrical connections becoming difficult due to warpage or the like is low, and the reliability of connection to the package stacked at the upper portion is remarkably enhanced.

The height of each surface side terminal 36 can be set to about 0.1 mm to 0.3 mm. In general, the thickness of the semiconductor chip 44 ranges from about 50 μm to 100 μm. The height of the surface side terminal 36 is preferably set to about twice or three times the thickness of the semiconductor chip 44.

Figure 4:
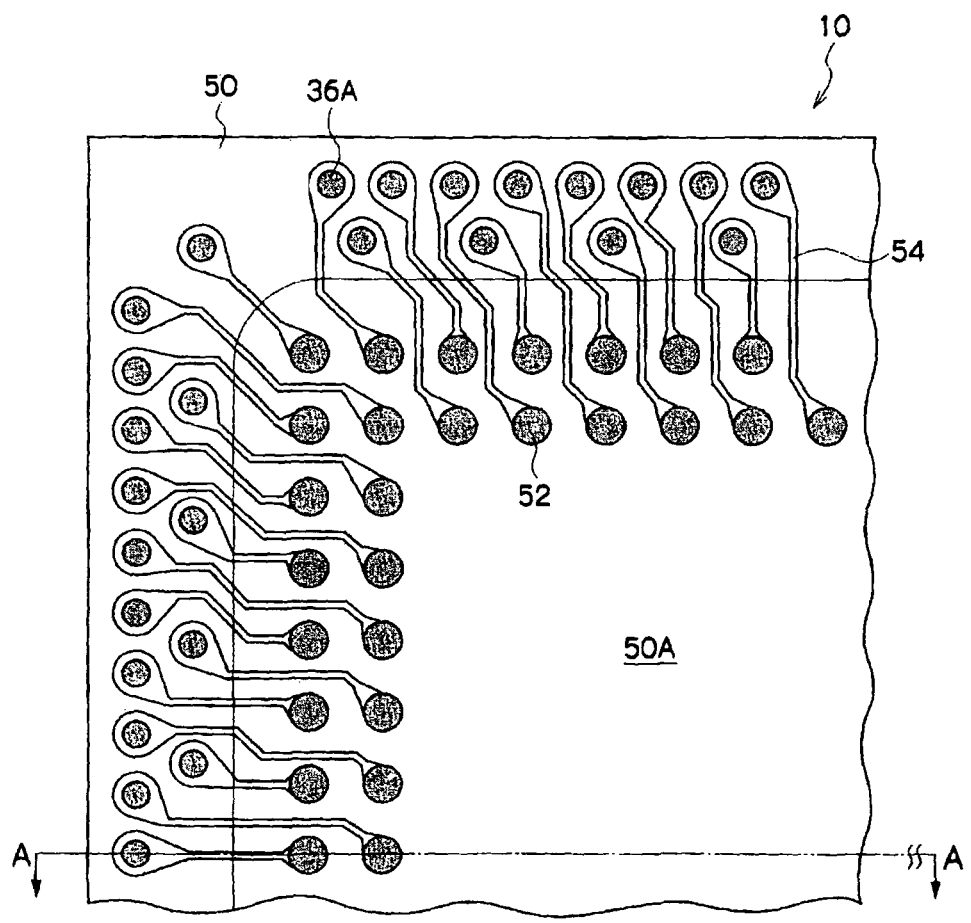
FIG. 4 is a partly plan view of the double-sided electrode package according to the first preferred embodiment as viewed from its surface side.

FIG. 4 is a partly plan view of the double-sided electrode package 10 as seen from its surface side. The figure illustrates the manner of an area equivalent to about ¼ of the surface of the double-sided electrode package 10. FIG. 1 is equivalent to a sectional view taken along A-A of FIG. 4. As described in FIG. 1, the surface of the package substrate 12 with the semiconductor chip 44 mounted thereon is covered with the sealing resin layer 50 with the end faces 36A of the surface side terminals 36 left behind. A plurality of the redistribution wiring pads 52, and the wirings 54 for connecting the redistribution wiring pads 52 and the end faces 36A in the one-to-one relationship are formed on the surface 50A of the sealing resin layer 50.

In the present embodiment as described above, the 106 surface side terminals 36 are disposed. Since the post-like surface side terminals 36 is provided approximately upright to the package substrate 12, the end faces 36A of the surface side terminals 36 are exposed to their corresponding positions of the surface side terminals 36. In the present embodiment, the 106 end faces 36A are exposed to the surface of the double-sided electrode package 10.

In the present embodiment as well, the 104 redistribution wiring pads 52 are provided on the surface of the double-sided electrode package 10. Each of the redistribution wiring pads 52 is electrically connected to any end face 35A by the corresponding wiring 54 in a one-to-one relationship. In the present embodiment, the 104 wrings 54 are provided on the surface of the double-sided electrode package 10 according to the number of the redistribution wiring pads 52. Since the surface of the sealing resin layer 50 is flat and the redistribution wiring pads 52 can be located (re-wired) in an arbitrary layout, the connection to the package laminated on the upper side becomes very easy. Needless to say, the number and layout of the redistribution wiring pads 52 can suitably be changed according to the positions or the like of the external connecting terminals of the package laminated on the upper side.

[Manufacturing Method of Double-Sided Electrode Package]

Figure 5:
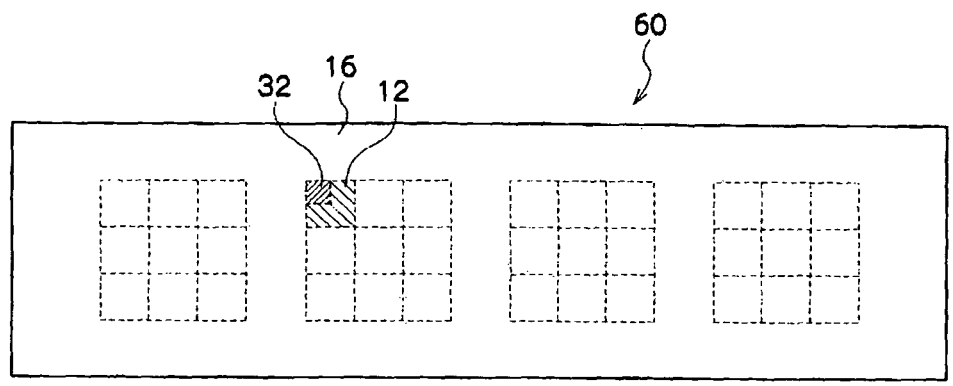
FIG. 5 is a plan view of a substrate frame formed with a plurality of package substrates as viewed from its surface side.

A method for manufacturing the double-sided electrode package 10 referred to above will next be explained. FIGS. 5 through 12 are respectively views showing a process for manufacturing the double-sided electrode package 10 according to the first preferred embodiment. In the present manufacturing process, a single substrate frame 60 formed with a plurality of package substrates 12 is used as shown in FIG. 5. Structures of double-sided electrode packages are formed on the substrate frame 60 every package substrate. Last, the substrate frame 60 is divided (brought into fractionization) into individual double-sided electrode packages by dicing the substrate frame 60. The manufacturing process of the double-sided electrode package 10 will be explained in due order.

(Preparatory Process Step of Substrate Frame)

Figure 6:
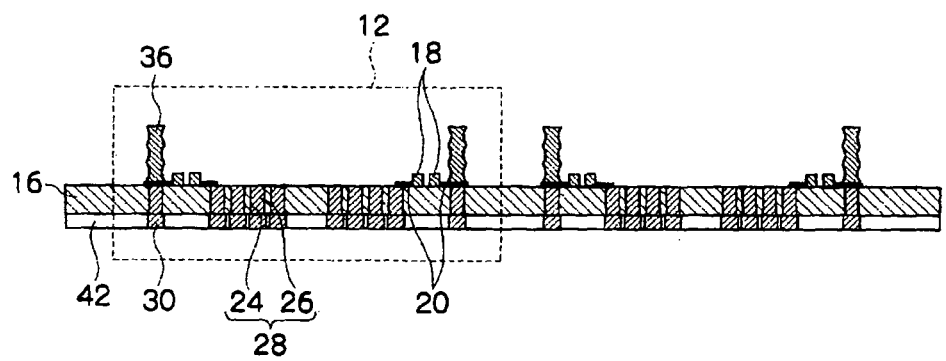
FIG. 6 is a partly sectional view of the substrate frame formed with the surface side terminals employed in the first preferred embodiment.
Figure 7:
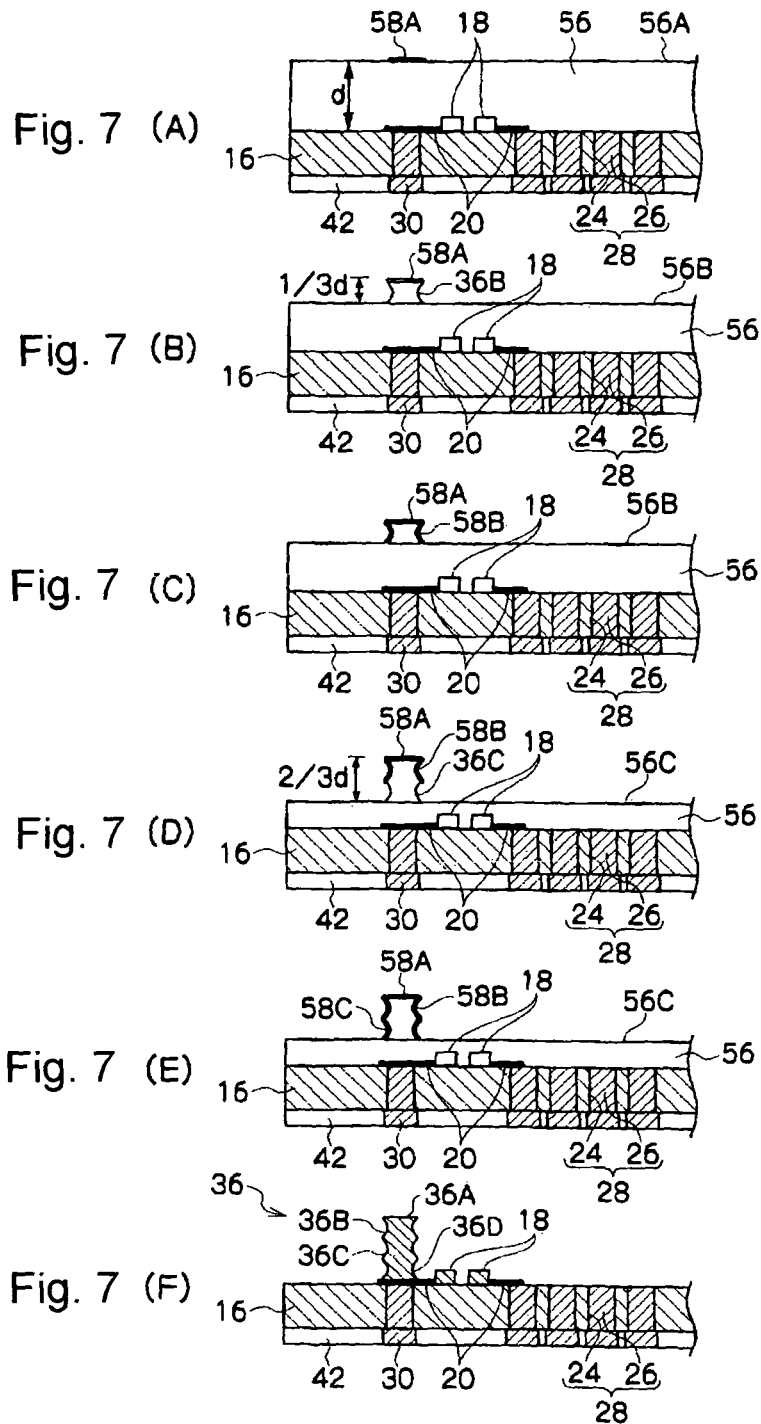
FIGS. 7(A) through 7(F) are respectively partly sectional views showing steps for forming surface side terminals employed in the first preferred embodiment.

A single substrate frame 60 formed with a plurality of package substrates 12 is first prepared. FIGS. 5, 6 and 7 are respectively views showing a step for preparing the substrate frame 60. FIG. 5 is a plan view of the substrate frame 60 as viewed from its surface side. FIG. 6 is a partly sectional view of the substrate frame 60.

A plurality of the package substrates 12 are formed in the elongated substrate frame 60. Here, as shown in FIG. 5, the 36 package substrates 12 are arranged in the substrate frame 60. The 36 package substrates 12 are divided into four sets nine by nine. As to one set, the nine package substrates 12 are disposed in a 3×3 matrix form. The respective sets are disposed at predetermined intervals along the longitudinal direction of the substrate frame 60. Incidentally, only the area 32 equivalent to about one-quarter of each package substrate 12 as shown in the upper left of the figure is illustrated in FIG. 2(B) or the like.

Only a portion or section including the two package substrates 12 is illustrated in FIG. 6. A section surrounded by a dotted line in the figure corresponds to the single package substrate 12 shown in FIGS. 1 and 2. The substrate frame 60 has a flat plate-shaped core material 16. A plurality of electrode pads 18, a plurality of wirings 20, a plurality of through electrodes 28, a plurality of lands 30, a plurality of surface side terminals 36 and a solder resist 42 are formed in the core material 16 every package substrate 12.

Each of the core material 16 and the solder resist 42 is comprised of an insulator. An organic resin or the like is preferred as the insulator. The solder resist 42 is formed by applying a heat resistant resin on the back surface of the core material 16, for example. The surface side terminals 36 are formed after the electrode pads 18, wirings 20, through electrodes 28, lands 30 and solder resist 42 have been formed. A method for fabricating the surface side terminals 36 will be explained in detail later.

The electrode pads 18, wirings 20, conductive material 26 charged into its corresponding via 24 of each through electrode 28 and lands 30, etc. are comprised of a material having conductivity as a matter of course. The electrode pads 18, wirings 20 and lands 30 are respectively formed by applying a conductive material such as solder paste onto the surface or back surface of the core material 16 in predetermined patterns, for example. A material low in electrical resistance is preferred as the conductive material.

Since the metal-made surface side terminals 36 are formed by etching after the formation of the electrode pads 18, wirings 20 and the like as described later, a conductive material insoluble in an etchant may preferably be used as for the electrode pads 18 and the wirings 20. Since the copper-made surface side terminals 36 are formed in the present embodiment, a conductive material insoluble in an aqueous ferric chloride solution corresponding to the etchant or etching solution may preferably be used as for the electrode pads 18 and the wirings 20. For, example, Tin-Lead (SnPb) or the like widely used as solder paste can be used.

FIGS. 7(A) through 7(F) are respectively views showing steps for forming surface side terminals 36 in respective package substrates. These steps are made up of three-stage wet etching steps. Incidentally, while the surface side terminals 36 are formed in the respective package substrates, the manner in which one surface side terminal 36 is formed is illustrated in FIGS. 7(A) through 7(F).

As shown in FIG. 7(A), a copper foil 56 having a thickness d is attached onto the surface of the core 16 formed with the electrode pads 18, wirings 20, through electrodes 28, lands 30 and solder resist 42. The thickness d of the copper foil 56 can be set to 0.1 mm to 0.3 mm. A plurality of etching masks 58A are formed on a surface 56A of the copper foil 56 to form a plurality of post-like surface side terminals 36. The respective masks 58A are respectively formed in predetermined patterns at positions opposite to drop-shaped ends of the wirings 20 formed on the surface of the core material 16. In the present embodiment, a plurality of small circular masks 58A are formed.

Next, as shown in FIG. 7(B), the copper foil 56 is etched up to a depth of about ⅓ d from the surface 56A using each of the masks 58A. Upon etching of the copper foil 56, the aqueous ferric chloride solution is used as an etchant. Wet etching may be performed by an immersion or spin system. When the copper foil 56 is etched to the depth of about ⅓ d, a post-like copper foil (Cu post) is left at a height of about ⅓ d below each mask 58A, and other portion of the copper foil 56 is removed at the same depth, thereby exposing a new surface 56B of the copper foil 56. Since the wet etching proceeds anisotropically, the copper foil 56 is side-etched up to below the mask 58A. Therefore, each of the Cu posts is not shaped into typical cylindrical form, but formed with a concave portion continuous in its circumferential direction at its side face 36B.

Next, as shown in FIG. 7(C), a mask 58B is formed at the side face 36B of each Cu post while the mask 58A at the top of the Cu post is being left behind. As shown in FIG. 7(D), the copper foil 56 is etched to a depth of about ⅔ d from the surface 56A using the mask 58A and the mask 58B. When the copper foil 56 is etched to a depth of about ⅔ d, a post-like copper foil (Cu post) is left below each mask 58A, and other portion of the copper foil 56 is removed at the same depth, thereby exposing a new surface 56C of the copper foil 56. The newly formed Cu post is side-etched, so that a concave portion continuous in its circumferential direction is formed at its side face 36C.

Next, as shown in FIG. 7(E), a mask 58C is formed on a side face 36C of each newly formed Cu post while the mask 58A at the top of each Cu post and the mask 58B at its side face are being left behind. As shown in FIG. 7(F), the copper foil 56 is etched using the masks 58A, 58B and 58C until the surface of the core material 16 is exposed.

When the copper foil 56 is etched until the surface of the core material 16 is exposed, a post-like copper foil (Cu post) is left below the mask 58A and other copper foils are all removed, whereby the end faces of the electrode pads 18, wirings 20 and through electrodes 28 formed in the surface of the core material 16 are exposed along with the core material 16. The newly formed Cu post is also side-etched so that a concave portion continuous in its circumferential direction is formed at its side face 36D. When the masks 58A, 58B and 58C are removed last, the corresponding post-like surface side terminal 36 whose end face 36A is flat and which is formed with the depressions and protrusions at its side face, is completed.

The side faces 36B, 36C and 36D each formed with the concave portion continuous in the circumferential direction are formed at the side face of the completed surface side terminal 36 in this order from the top. Therefore, for example, a protrusion (convex portion continuous in the circumferential direction) is formed between the side faces 36B and 36C. Similarly, protrusions are respectively formed between the end face 36A and the side face 36B and between the side face 36C and the side face 36D.

Executing wet etching of the copper foil 56 plural times in parts makes it possible to obtain protrusions equal to the number corresponding to the number of times that etching is performed. In the present embodiment, the surface side terminal 36 provided with the three protrusions at its side face can be obtained by performing wet etching of the copper foil 56 in three stages. In the present embodiment as well, the side faces 36B, 36C and 36D are set so as to be approximately identical in shape by performing triple etching under similar conditions, for example.

The number of protrusions is not limited to three, but may be two or four or more. Although, as the number of protrusions increases, the number of steps of etching increases and a fabrication process is hence complicated, the adhesion to a sealing resin is enhanced. While a pointed shape or the like approximately triangular in section is considered as the shape of the protrusion, the shape thereof may be a shape whose top is flat. The height of the surface side terminal 36 can be set to 0.1 mm to 0.3 mm. The diameter (diameter of convex portion) of the surface side terminal 36 at its thickness portion is preferably about 0.5 to 1.0 times the height of the surface side terminal 36 and can be set to about 0.05 mm to 0.3 mm.

The diameter of the surface side terminal 36 at its concave portion is preferably set to about 80% of the diameter thereof at its convex portion. If, for example, the diameter of the surface side terminal 36 at its convex portion is 0.15 mm, then the diagram of the concave portion can be 0.12 mm. The higher the height of each protrusion, the harder it is to set the condition for etching. However, the adhesion to the sealing resin is enhanced. Incidentally, the diameter of the post-like surface side terminal 36 corresponds to the diameter of a cut surface obtained when the surface side terminal 36 is cut by the surface parallel to the surface of the package substrate 12 (core material 16). In the post-like surface side terminal 36, its cut surface is circular and "the diameter" means its diameter.

(Layout Process Step of Semiconductor Chip)

Figure 8:
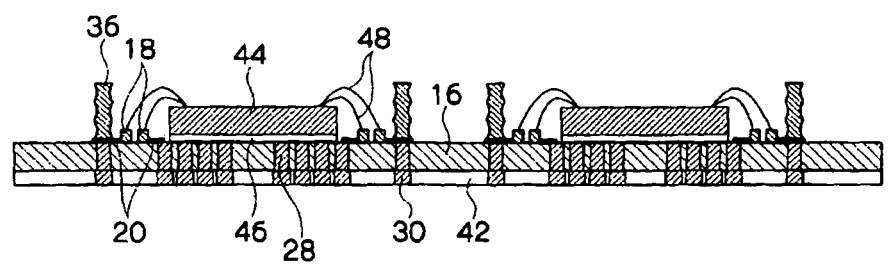
FIG. 8 is a view showing a step for laying out semiconductor chips and is a partly sectional view of a substrate frame with the semiconductor chips mounted thereon.
Figure 9:
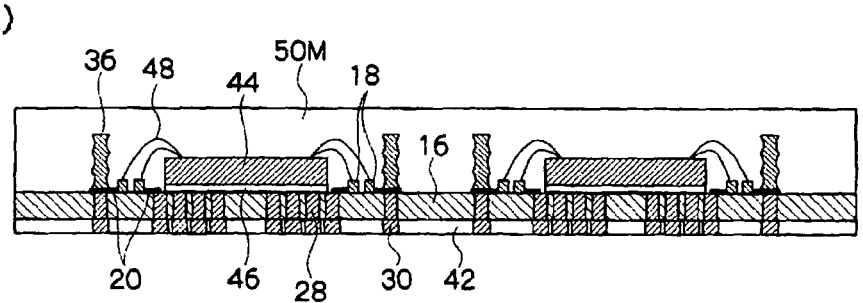
Figure 9:
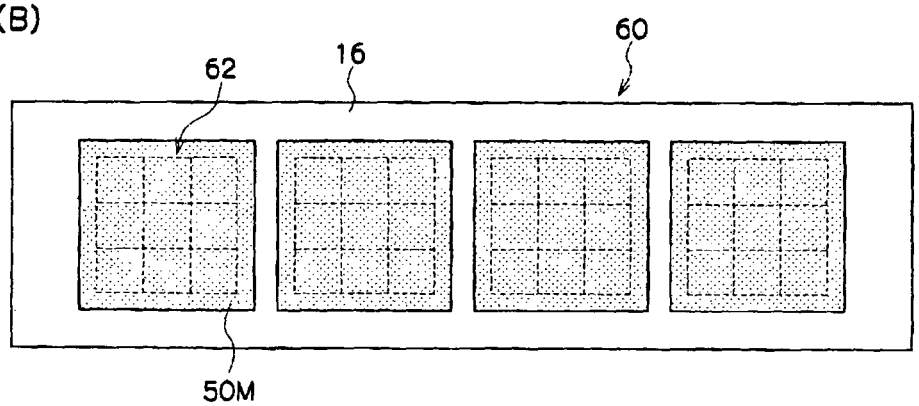

Next, each semiconductor chip 44 is disposed or laid out in a chip layout area 14 of each individual package substrate 12. FIG. 8 is a partly sectional view of a substrate frame, showing a step for laying out each semiconductor chip. The semiconductor chips 44 such as an IC chip, an LSI chip, etc. are fabricated by dicing a semiconductor wafer with the same circuits formed therein in plural form into individual circuits. A plurality of electrodes are provided on the surface of each semiconductor chip 44.

A chip-fixing die bond material 46 is boned or attached onto the chip layout area 14 located in the center of each package substrate 12. The die bond material 46 is an insulating bonding or adhesive material. For example, a pressure sensitive adhesive sheet or the like can be used therefor. The back surface of the semiconductor chip 44 is bonded onto the package substrate 12 by using the die bond material 46. Thus, the semiconductor chip 44 is fixed onto the surface of the package substrate 12. As shown in FIG. 5, a plurality of the package substrates 12 are formed in the substrate frame 60. The semiconductor chip 44 is fixed onto each of these package substrates 12.

Next, the electrodes provided on the surface of each semiconductor chip 44 and the electrode pads 18 are wire-bond by metallic wires 48 using a bonding device such as a wire bonder or the like. A thin line of gold (Au) can be used as the metallic wires 48. As shown in FIG. 8, the metallic wires 48 are mounted over between each semiconductor chip 44 and the electrode pads 18 in loop form. At this time, the loop height of each metallic wire 48 is set lower than the height of the surface side terminal 36.

(Sealing Step of Semiconductor Chip)

Next, the semiconductor chips 44 are sealed with a sealing resin.

FIGS. 9(A) and 9(B) are views showing a step for sealing each semiconductor chip. FIG. 9(A) is a partly sectional view of the resin-sealed substrate frame, and FIG. 9(B) is a plan view of the substrate frame as seen from its surface side.

The sealing using the sealing resin is performed based on a transfer method by setting the substrate frame 60 in which the semiconductor chips 44 are laid out in their corresponding chip layout areas 14, to an unillustrated mold die. The sealing resin is injected and charged into the mold die thereby to cover the surface of the substrate frame 60 with the sealing resin 50M.

A range wider than each area 62 (indicated by a dotted line) formed with a plurality of the package substrates 12 is covered with the sealing resin 50M. An epoxy resin can be used as the sealing resin. The sealing resin is charged so as to fill a space defined between the semiconductor chips 44 and the substrate frame 60. The surface of the substrate frame 60 is covered with the sealing resin 50M such that the surface side terminals 36 are covered with the sealing resin 50M.

After the completion of molding, the substrate frame 60 is taken out from the mold die and the sealing step is completed. With the covering of the surface of the substrate frame 60 with the sealing resin 50M, the electrode pads 18, wirings 20 and metallic wires 48 are also simultaneously sealed along with the semiconductor chip 44. Further, the semiconductor chips 44 laid out in the respective chip layout areas 14 are collectively sealed by covering the area broader than the area 62 with the sealing resin 50M.

(Grinding Step of Sealing Resin)

The sealing resin 50M is next ground from its surface side.

Figure 10:
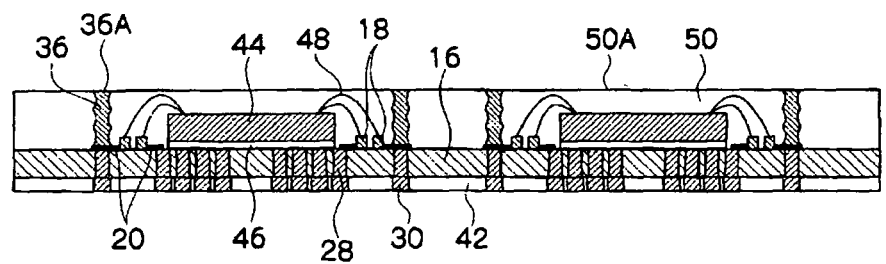
FIG. 10 is a view showing a step for grinding a sealing resin and is a partly sectional view of the post-grinding substrate frame.

FIG. 10 is a view showing a step for grinding the sealing resin and is a partly sectional view of the post-grinding substrate frame. After the surface of the substrate frame 60 has been covered with the sealing resin 50M, the sealing resin 50M is ground from its surface side using a grinding device such as a grinder until the end faces 36A of the surface side terminals 36 are exposed. Thus, a sealing resin layer 50 is formed to the same height as each of the surface side terminals 36, and the surface 50A of the sealing resin layer 50 is flush with each end face 36A. The surface 50A becomes parallel to the surface of the core member 16.

Incidentally, although a description has been made above of the example in which after the sealing resin 50M has been formed thick, the formed sealing resin SOM is ground from its surface side to form the sealing resin layer 50, the sealing resin layer 50 of the same height as the end faces 36A of the surface side terminals 36 may be formed by the transfer method (mold shaping). An advanced mold fabrication technique is however required to form a thin sealing resin layer 50 by the conventional transfer method. In contrast, it becomes easy to form the thin sealing resin layer 50 by grinding the molded sealing resin 50M from its surface side.

In any case, the surface of the substrate frame 60 is uniformly covered with the sealing resin layer 50 except for the end faces 36A of the surface side terminals 36. Accordingly, the peeling-off of the resin is hard to occur compared with the case where the surface of the substrate frame 60 is covered with a plurality of types of resins different in thermal expansion coefficient and heat shrinkage coefficient.

(Redistribution Wiring Step)

Redistribution wiring is done on the surface 50A of the sealing resin layer 50.

Figure 11:
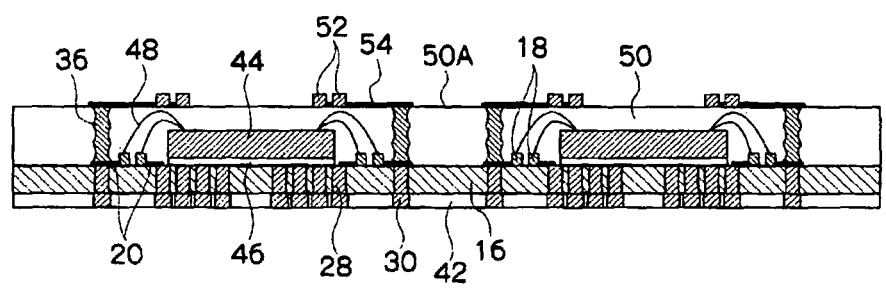
FIG. 11 is a view showing a redistribution wiring step and is a partly sectional view of the substrate frame subsequent to the redistribution wiring.
Figure 12:
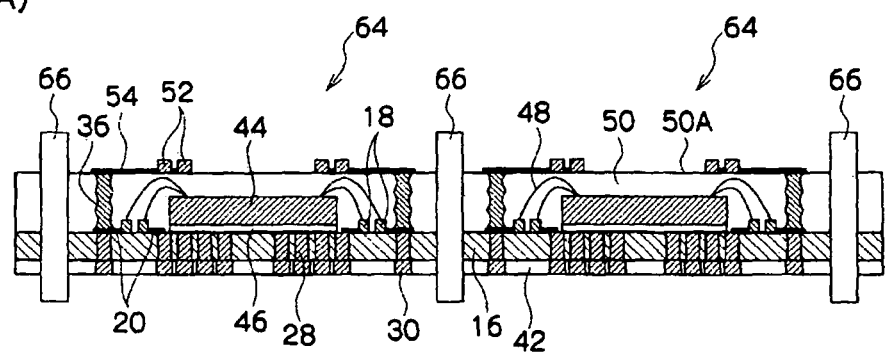
Figure 12:
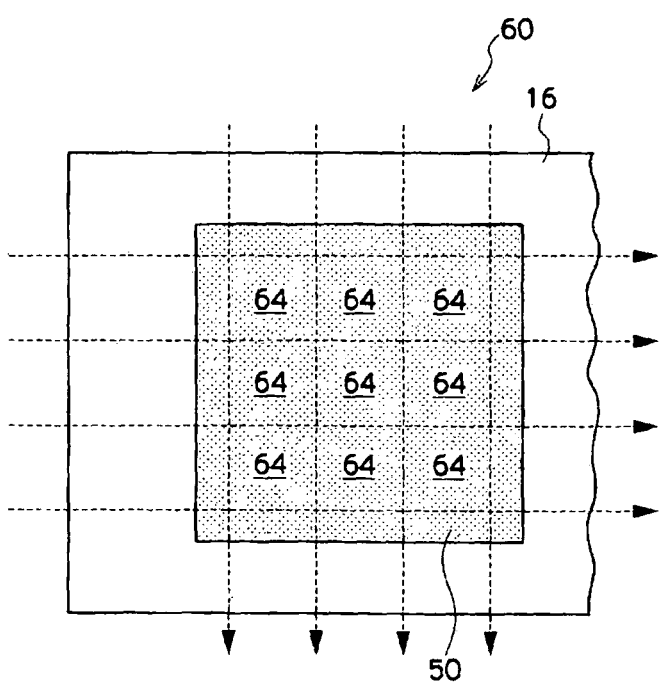

FIG. 11 is a view showing a redistribution wiring step and is a partly sectional view of the substrate frame subsequent to the redistribution wiring.

Redistribution wiring pads 52 and wirings 54 are formed on the surface 50A of the sealing resin layer 50 in predetermined redistribution wiring patterns by metallic nanoparticles. Since the end faces 36A of the surface side terminals 36 and the surface 50A of the sealing resin layer 50 are formed to the same height (to be flush with one another) in the present embodiment, it is easy to form the redistribution wiring patterns. Since the surface 50A obtained by grinding is rough or coarse, the adhesion of the surface 50A to the redistribution wiring pads 52 and the wirings 54 is excellent.

The metallic nanoparticles are metal particles each having a particle diameter that ranges from about 1 nm to 100 nm. For example, copper nanoparticles can be used as the metallic nanoparticles. The redistribution wiring patterns can be formed by inkjet printing using ink containing the metallic nanoparticles or screen printing using past containing the metallic nanoparticles. When ink or paste containing the metallic nanoparticles is used, reduction using atomic hydrogen is performed after the formation of the redistribution patterns thereby to remove contamination and oxides due to organic solvents or the like.

(Dicing Step)

Last, the substrate frame 60 is diced to individualize the respective packages.

FIGS. 12(A) and 12(B) are respectively views showing a dicing step. FIG. 12(A) is a partly sectional view of the substrate frame at dicing, and FIG. 12(B) is a plan view of the substrate frame at dicing as viewed from its surface side. The plan view of FIG. 12(B) illustrates part of the substrate frame 60, corresponding to a set (nine) of package substrates 12.

A plurality of package structures 64 have been formed on the substrate frame 60. In the present embodiment as shown in FIG. 12(B), nine double-sided electrode package structures 64 are arranged at an unillustrated portion of the substrate frame 60 in a 3×3 matrix form. An unillustrated blade is moved in the directions indicated by arrows to saw-cut the substrate frame 60 in grid form, thereby bringing the respective double-sided electrode package structures 64 into fractionalization. The substrate frame 60 corresponding to blade passage regions 66 is cut off by saw cutting. A diamond blade or the like can be used as the blade. Consequently, the double-sided electrode package 10 according to the first preferred embodiment is completed.

According to the present embodiment as described above, the adhesion to the sealing resin is remarkably enhanced by an anchor effect because the surface side terminals 36 are provided with the plural protrusions at their side faces while the peripheries of the surface side terminals 36 are buried by the sealing resin. Therefore, the surface side terminals 36 and the sealing resin layer 50 are hard to peel off and hence the moisture-resistant reliability of the double-sided electrode package 10 is remarkably enhanced.

The remarkable enhancement of the adhesion to the sealing resin means that even though the environmental temperature to which the double-sided electrode package 10 is exposed changes and thereby the metallic surface side terminals 36 expand and contract, the sealing resin layer 50 follows it. Therefore, the possibility of electrical connections becoming difficult due to warpage or the like is low, and the reliability of connection to the package stacked at the upper portion is remarkably enhanced.

According to the present embodiment as well, since the metallic surface side terminals 36 are formed on the package substrate 12 by etching of the laminated copper foil, there are no thermal distortion-concentrated spots as compared with the case where the metallic terminals are formed by soldering. Therefore, durability to the change in the environmental temperature is high.

Since the double-sided electrode package 10 according to the present embodiment has such a simple structure that the sealing resin layer 50 is formed so as to fill or bury the peripheries of the surface side terminals 36 formed in the package substrate 12, the double-sided electrode package 10 can be manufactured simply and at low cost without performing complex processing such as counterboring processing for the package substrate, laser processing for a number of through holes, etc.

In the present embodiment, since the surface of the sealing resin layer 50 is flat and the redistribution wiring pads 52 can be disposed (rewired or subjected to redistribution wiring) at the surface of the double-sided electrode package 10 in the arbitrary layout, the connection to the package laminated on the upper side becomes very easy.

In the present embodiment, the surface prior to the redistribution wiring of the double-sided electrode package 10 is covered with one kind of sealing resin layer 50. Thus, as compared with the case where the surface is covered with the plural types of resins different in thermal expansion coefficient and thermal shrinkage coefficient, the peeling-off of the resin is hard to occur and the moisture-resistant reliability is high. Namely, it is possible to prevent the peeling-off of the resin due to heat such as reflow (soldering) at substrate mounting. It is thus possible to prevent the penetration of moisture into the package and breaks due to the peeling-off of the redistribution wiring patterns.

In the present embodiment, since the formed sealing resin 50M is ground from its surface side after the sealing resin 50M has been formed thick, thereby to form the sealing resin layer 50, the thin sealing resin layer 50 can easily be formed without using the advanced mold fabrication technique. The ground surface is rough or coarse and the adhesion to the redistribution wiring patterns is excellent. Therefore, breaking due to the peeling-off of the redistribution wiring patterns is hard to occur.

In the present embodiment, the electrode pads 18 and the surface side terminals 36 are arranged in plural rows and arranged in zigzags thereby to make it easy to perform wiring and increase the numbers of the arranged electrode pads 18 and surface side terminals 36. This is thus adaptable even to a multi-pin configuration of each semiconductor chip 44. Increasing the number of the arranged surface side terminals 36 in particular makes it possible to bond the surface side terminals 36 and the sealing resin layer 50 to one another more securely.

Second Preferred Embodiment

[Double-Sided Electrode Package]

Figure 13:
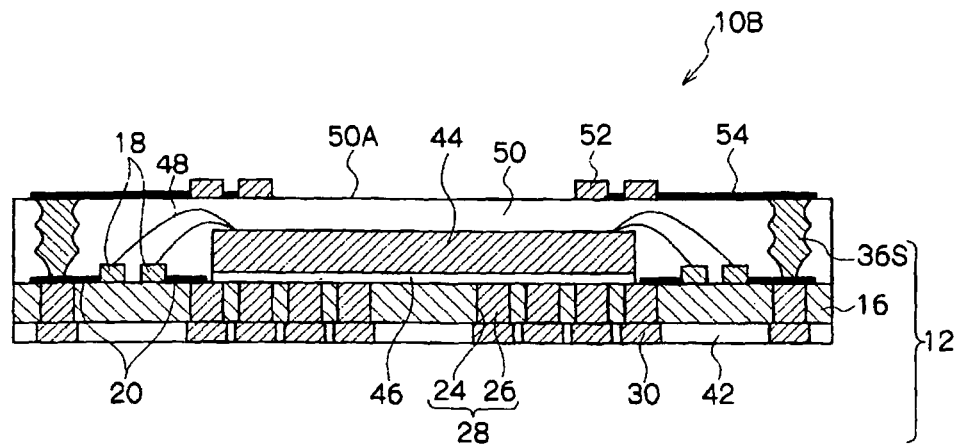
FIG. 13 is a schematic sectional view showing a configuration of a double-sided electrode package according to a second preferred embodiment of the present invention.

FIG. 13 is a schematic sectional view showing a configuration of a double-sided electrode package according to a second preferred embodiment of the present invention. The double-sided electrode package 10B according to the second preferred embodiment has the same structure as the double-sided electrode package 10 according to the first preferred embodiment except that one end sides (basal portions of posts) of surface side terminals 36S respectively electrically connected to wirings 20 are made more slender than the other end sides thereof. Therefore, the same reference numerals are respectively attached to the same constituent parts, and their explanations are omitted.

Even in the present embodiment, the surface side terminals 36S have a plurality of protrusions respectively in a manner similar to the first preferred embodiment. With the provision of the plural protrusions, wavy depressions and projections are formed at the side faces of the post-like surface side terminals 36S. The adhesion to a sealing resin is remarkably enhanced since the surface side terminals 36 include the depressions and projections at their side faces. Even though an environmental temperature to which the double-sided electrode package 10B is exposed changes and thereby the metallic surface side terminals 36S expand and contract, a sealing resin layer 50 follows it, and the reliability of connection to the package laminated at an upper portion is substantially enhanced.

As described above, FIGS. 2(A) and 2(B) merely illustrate one example of the layout at the package substrate 12. The numbers and layouts of electrode pads 18, wirings 20, through electrodes 28 and surface side terminals 36S of a package substrate 12 can suitably be changed according to the number of electrodes (pins) of a semiconductor chip 44, the size of the semiconductor chip 44 and the like. Since the basal portions of the surface side terminals 36S are formed thin in the present embodiment in particular, the present embodiment is adaptable even to fine pitching of substrate wirings by a multi-pin configuration of the semiconductor chip 44.

For instance, FIG. 3 is a view for describing the shape of each of the surface side terminals 36 employed in the first preferred embodiment. In FIG. 3, the end of each outer wiring 20$_{out}$ is formed to the drop-shaped pattern one size larger than the section (approximately circular shape) of each surface side terminal 36. Each of the post-like surface side terminals 36 stands on the drop-shaped end of each wiring 20 approximately vertically. On the other hand, since the basal portions of the surface side terminals 36S are formed thin in the present embodiment, the end of each outer wiring 20$_{out}$ can be formed with the same width as other portion. Fine wiring is enabled. It is thus possible to form a larger number of surface side terminals 36S and a larger number of outer wirings 20$_{out}$ in association with the multi-pin configuration of the semiconductor chip 44.

On the other hand, since the other end side (top of each post) of each surface side terminal 36S is formed with the same thickness as the first preferred embodiment, each end face 36A thereof becomes the same size (area) as the first preferred embodiment. Therefore, no trouble occurs in redistribution wiring at the surface of the sealing resin layer 50, and the reliability of connection to the package laminated at the upper portion is maintained.

Incidentally, one end side of each surface side terminal 36S electrically connected to the wiring 20 may be made thinner than the basal portion of each post in the first preferred embodiment. Further, the other end side of the surface side terminal 36S may be thicker than the top of each post in the first preferred embodiment. The reliability of connection to the package laminated at the upper portion is further enhanced by increasing the area of the end face 36A of each surface side terminal 36S, i.e., the area of a terminal junction to the package laminated at the upper portion.

[Manufacturing Method of Double-Sided Electrode Package]

A method for manufacturing the double-sided electrode package 10B will next be explained. Since the double-sided electrode package 10B can be manufactured in the same manner as the double-sided electrode package 10 according to the first preferred embodiment except for a process for forming the surface side terminals 36S, its description is omitted except for the dissimilarities. The forming process of the surface side terminals 36S comprises the three-stage wet etching steps shown in FIGS. 7(A) through 7(F). The surface side terminals 36S at which the basal portions of the posts thereof are made slender, are also fabricated in accordance with a method approximately identical to it. When, however, the copper foil 56 is etched until exposure of the surface of the core material 16 as shown in FIG. 7(F), the etching is performed on the condition that side etch is made higher than the previous time in degree as in the case where, for example, the concentration of an etchant is increased and the etching time is made long. Thus, the side face 36D of a newly formed Cu post is bored deep. The newly formed Cu post becomes approximately conical.

The side faces 36B, 36C and 36D each formed with the concave portion continuous in the circumferential direction are formed at the side face of each surface side terminal 36S in this order from the top, so that the three protrusions are formed. In the present embodiment, the wet etching of the copper foil 56 is performed in three stage in a manner similar to the first preferred embodiment to obtain each surface side terminal 36 provided with the three protrusions at its side face. However, the third etching for exposing the core material 16 is done on the condition that side etch is made higher than the first etching and the second etching in degree. Thus, the side face D is bored deeper than the side faces 36B and 36C to make the basal portion of each surface side terminal 36S slender.

Incidentally, when it is desired to increase the area of the end face 36A of each surface side terminal 36S, the area of the mask 58A is increased at the step for forming the mask 58A shown in FIG. 7(A).

According to the present embodiment as described above, the adhesion to the sealing resin is remarkably enhanced by an anchor effect because the surface side terminals 36S are provided with the plural protrusions at their side faces while the peripheries of the surface side terminals 36S are buried by the sealing resin. Therefore, the surface side terminals 36S and the sealing resin layer 50 are hard to peel off and hence the moisture-resistant reliability of the double-sided electrode package 10B is remarkably enhanced.

The remarkable enhancement of the adhesion to the sealing resin means that even though the environmental temperature to which the double-sided electrode package 10B is exposed changes and thereby the metallic surface side terminals 36S expand and contract, the sealing resin layer 50 follows it. Therefore, the possibility of electrical connections becoming difficult due to warpage or the like is low, and the reliability of connection to the package stacked at the upper portion is remarkably enhanced.

According to the present embodiment as well, since the metallic surface side terminals 36S are formed on the package substrate 12 by etching of the laminated copper foil, there are no thermal distortion-concentrated spots as compared with the case where the metallic terminals are formed by soldering. Therefore, durability to the change in the environmental temperature is high.

Since the double-sided electrode package 10B according to the present embodiment has such a simple structure that the sealing resin layer 50 is formed so as to bury the peripheries of the surface side terminals 36S formed in the package substrate 12, the double-sided electrode package 10B can be manufactured simply and at low cost without performing complex processing such as counterboring processing for the package substrate, laser processing for a number of through holes, etc.

Since the basal portions of the surface side terminals 36S are formed slender in the present embodiment in particular, the present embodiment is adaptable even to fine pitching of the substrate wirings by the multi-pin configuration of the semiconductor chip 44. By making thinner the width of each wiring 20 for connecting the basal portion of each surface side terminal 36S, for example, a larger number of surface side terminals 36S and wirings 20 can be formed in association with the multi-pin configuration of the semiconductor chip 44. Namely, inner wirings can be formed in arbitrary layouts according to the number of pins of each semiconductor chip. Increasing the number of the arranged surface side terminals 36S makes it possible to bond the surface side terminals 36S and the sealing resin layer 50 to one another more securedly.

The present embodiment is similar to the first preferred embodiment even in the following points. (1) Redistribution wiring is enabled in arbitrary layouts at the surface of the double-sided electrode package 10B, and the connection to the package laminated on the upper side becomes very easy. (2) The surface prior to the redistribution wiring, of the double-sided electrode package 10B is covered with one kind of sealing resin, and hence the peeling-off of the resin is hard to occur and the moisture-resistance reliability is high. (3) The thin sealing resin layer 50 can easily be formed by grinding without using the advanced mold fabrication technique. (4) The electrode pads 18 and the surface side terminals 36S are arranged in plural rows and arranged in zigzags, whereby wiring is made easy and the numbers of the electrode pads 18 and the surface side terminals 36S can also be further increased.

Third Preferred Embodiment

[Double-Sided Electrode Package]

Figure 14:
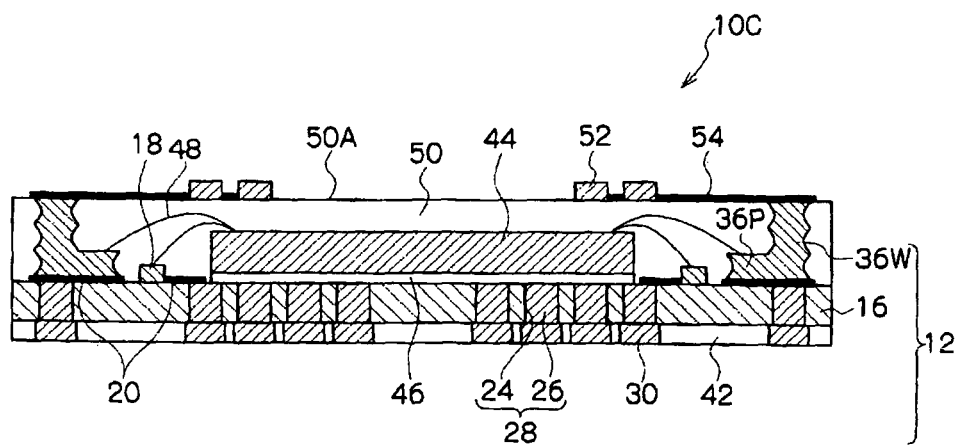
FIG. 14 is a schematic sectional view illustrating a configuration of a double-sided electrode package according to a third preferred embodiment of the present invention.

FIG. 14 is a schematic sectional view showing a configuration of a double-sided electrode package according to a third preferred embodiment of the present invention. The double-sided electrode package 10C according to the third embodiment is identical in structure to the double-sided electrode package 10 according to the first preferred embodiment except that the former includes steps or steplike portions 36P provided at one end sides (basal portions of posts) of surface side terminals 36W electrically connected to wirings 20, and the step-like portions 36P serve as boding pads (outer electrode pads $18_{out}$ of FIG. 1) for connecting a semiconductor chip 44. Therefore, the same reference numerals are respectively attached to the same constituent parts or elements and their explanations are omitted.

Since the step-like portions 36P of the surface side terminals 36W act as the bonding pads for connecting the semiconductor chip 44 in the present embodiment, there is no need to provide outer electrode pads (outer electrode pads $18_{out}$ in FIG. 1) as in the first preferred embodiment. Since the bonding pads are formed integrally with the surface side terminals 36W, outer wirings $20_{out}$ connected to one ends of the surface side terminals 36 can also be formed in pad form.

Figure 15:
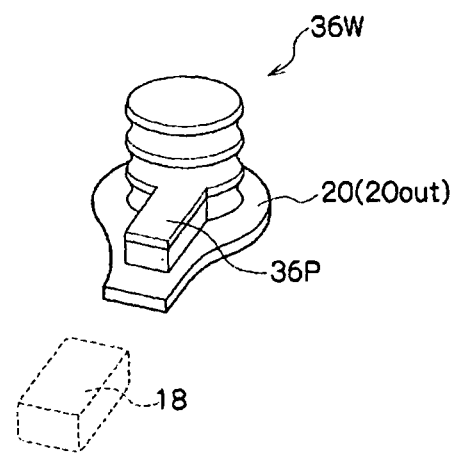
FIG. 15 is a perspective view showing the shape of a surface side terminal formed in the third preferred embodiment.

FIG. 15 is a perspective view of one surface side terminal 36W as viewed from obliquely upward. Each of the outer wirings $20_{out}$ is formed to a drop-like pattern one size larger than a lower section (keyhole shape) of each of the surface side terminals 36W. Each of the surface side terminals 36W stands on its corresponding wiring 20 approximately vertically. The surface side terminal 36W is provided with a plurality of protrusions (convex portions continuous in its circumferential direction) formed at its side face over its full circumference along the circumferential direction.

In the present embodiment, each of the surface side terminals 36W is provided with the step-like portion 36P at its lower portion. The top of the step-like portion 36P is flat and the surface side terminal 36W is formed stepwise. The step-like portion 36P is formed so as to protrude in the direction (direction in which the electrode pads 18 are disposed in FIG. 15) in which the semiconductor chip 44 is disposed, as viewed from the basal portion of each cylindrical post. The height of the step-like portion 36P is set to the same height as the protrusion provided at the lowest side (side close to the wiring 20) of each surface side terminal 36W. If the height of the step-like portion 36P is set to the same height as the electrode pad 18, then wire bonding to the semiconductor chip 44 becomes easier.

Even in the present embodiment, each of the surface side terminals 36W is provided with the plural protrusions in a manner similar to the first preferred embodiment. With the provision of the plural protrusions, wavy depressions and projections are formed at the side face of each post-like surface side terminal 36W. The adhesion to a sealing resin is remarkably enhanced since the surface side terminals 36W are provided with the depressions and projections at their side faces. Even though an environmental temperature to which the double-sided electrode package 10C is exposed changes and thereby the metallic surface side terminals 36W expand and contract, a sealing resin layer 50 follows it, and the reliability of connection to the package laminated at an upper portion is hence remarkably enhanced.

As described above, FIGS. 2(A) and 2(B) merely illustrate one example of the layout at the package substrate 12. The numbers and layouts of the electrode pads 18, wirings 20, through electrodes 28 and surface side terminals 36W of each package substrate 12 can suitably be changed according to the number of electrodes (pins) of the semiconductor chip 44, the size of the semiconductor chip 44 and the like.

Since the step-like portions 36P of the surface side terminals 36W serve as the bonding pads in the present embodiment in particular, there is no need to provide the outer electrode pads as in the first preferred embodiment, and the wirings 20 become also simple. Thus, when the area for laying out each surface side terminal 36W is set in a manner similar to the first preferred embodiment, the electrode pads 18 can be disposed more outwardly and the area for mounting the semiconductor chip 44 is spread up to near the surface side terminals 36W. Consequently, a larger semiconductor chip 44 can be mounted.

The first preferred embodiment has explained the example in which, for instance, the size of the package substrate 12 is 13 mm×13 mm, the surface side terminals 36 are disposed within the range of about 1.3 mm from the outer periphery of the package substrate 12, and the electrode pads 18 are arranged inwardly by about 2 mm from the outer periphery of the package substrate 12 (refer to FIG. 2). On the other hand, according to the present embodiment, the electrode pads 18 can be disposed inwardly by about 1.3 mm from the outer periphery of the package substrate 12, and all of their inner regions or areas can be set as the mounting area of the semiconductor chip 44.

[Manufacturing Method of Double-Sided Electrode Package]

A method for manufacturing the double-sided electrode package 10 will next be explained. Since the present double-sided electrode package 10C can be manufactured in a manner similar to the double-sided electrode package 10 according to the first embodiment except for the process for forming the surface side terminals 36W, the description thereof is omitted except for the dissimilarities therebetween. Since the numbers and layouts of the electrode pads 18 and the wirings 20 can suitably be changed in the manufacturing process although the present double-sided electrode package 10C is different from the double-sided electrode package 10 according to the first preferred embodiment in terms of the numbers and layouts of the electrodes 18 and wirings 20, their explanations are omitted herein.

The process for forming the surface side terminals 36W comprises three-stage wet etching steps in a manner similar to the first preferred embodiment. The surface side terminals 36W provided with the step-like portions 36P are fabricated by a method approximately identical to it. As shown in FIGS. 7(A) through 7(D), etching is done twice in a manner similar to the first preferred embodiment. Incidentally, the present embodiment is different from the first preferred embodiment in the numbers and layouts of the electrode pads 18 and the wirings 20 as described above.

When the copper foil 56 is etched to a depth of about ⅔ d in FIG. 7(D), a post-like copper foil (Cu post) is left below each mask 58A, and other portion of the copper foil 56 is removed at the same depth, thereby exposing a new surface 56C of the copper foil 56. The newly formed Cu post is also side-etched, so that a concave portion continuous in its circumferential direction is formed at its side face 36C.

Figure 16:
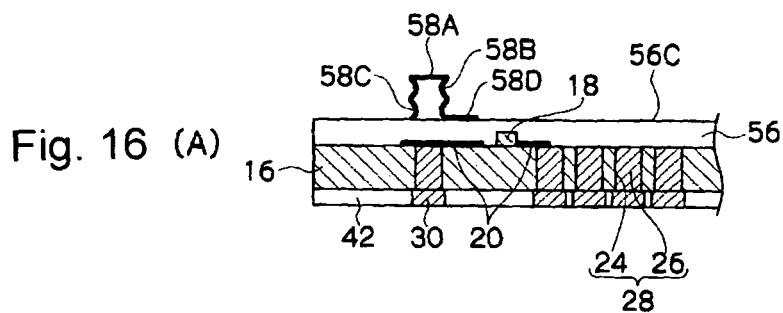
FIGS. 16(A) and 16(B) are respectively partly sectional views each showing part of a step for forming each surface side terminal formed in the third preferred embodiment.
Figure 16:
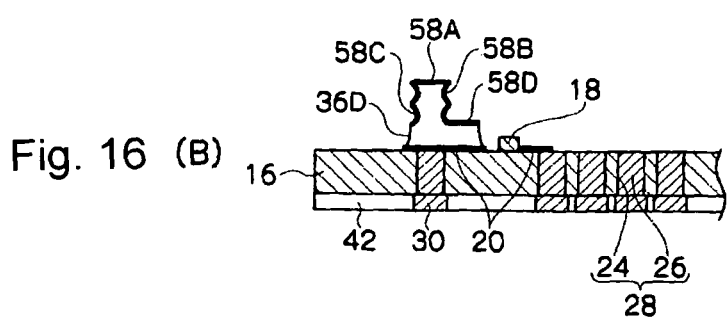

Next, as shown in FIG. 16(A), a mask 58C is formed on a side face 36C of each newly formed Cu post and a rectangular mask 58D extending in the direction of a chip layout area from the Cu post is formed on the surface 56C, while the mask 58A at the top of each Cu post and the mask 58B at its side face are being left behind. As shown in FIG. 16(B), the copper foil 56 is etched using the masks 58A, 58B and 58C until the surface of the core material 16 is exposed.

When the copper foil 56 is etched until the surface of the core material 16 is exposed, a post-like copper foil (Cu post) is left below the mask 58A and the mask 58D and other copper foils are all removed, whereby the end faces of the electrode pads 18, wirings 20 and through electrodes 28 formed in the surface of the core material 16 are exposed along with the core material 16. The newly formed Cu post is also side-etched so that a concave portion continuous in its circumferential direction is formed at its side face 36D. When the masks 58A, 58B, 58C and 58D are removed last, a post-like surface side terminal 36W, which includes an end face 36A whose top is flat and a step-like portion 36P whose top is flat and which is formed with depressions and projections at its side face, is completed.

Side faces 36B, 36C and 36D each formed with a concave portion continuous in the circumferential direction are formed at the side face of the completed surface side terminal 36W in this order from the top. A side face of the step-like portion 36P is also included in the side face 36D. A protrusion (concave portion continuous in the circumferential direction) is formed between the side face 36B and the side face 36C. Similarly, protrusions are respectively formed between the adjacent side faces. Thus, the three protrusions are formed at the side face of each surface side terminal 36W.

Executing wet etching of the copper foil 56 in three stages makes it possible to obtain the surface side terminal 36 provided with the three protrusions at its side face in the present embodiment. In the present embodiment, the rectangular mask 58D extending in the direction of the chip layout area from the Cu post is formed on the corresponding surface 56C exposed by etching the copper foil 56 to the depth of about ⅔ d. By performing etching corresponding to the third time using the mask 58D, the corresponding step-like portion 36P that protrudes from the basal portion of each cylindrical post can be formed.

According to the present embodiment as described above, the adhesion to the sealing resin is remarkably enhanced by an anchor effect because the surface side terminals 36W are provided with the plural protrusions at their side faces while the peripheries of the surface side terminals 36W are buried by the sealing resin. Therefore, the surface side terminals 36W and the sealing resin layer 50 are hard to peel off and hence the moisture-resistant reliability of the double-sided electrode package 10C is remarkably enhanced.

The remarkable enhancement of the adhesion to the sealing resin means that even though the environmental temperature to which the double-sided electrode package 10C is exposed changes and thereby the metallic surface side terminals 36W expand and contract, the sealing resin layer 50 follows it. Therefore, the possibility of electrical connections becoming difficult due to warpage or the like is low, and the reliability of connection to the package stacked at the upper portion is remarkably enhanced.

According to the present embodiment as well, since the metallic surface side terminals 36W are formed on the package substrate 12 by etching of the laminated copper foil, there are no thermal distortion-concentrated spots as compared with the case where the metallic terminals are formed by soldering. Therefore, durability to the change in the environmental temperature is high.

Since the double-sided electrode package 10C according to the present embodiment has such a simple structure that the sealing resin layer 50 is formed so as to bury the peripheries of the surface side terminals 36W formed in the package substrate 12, the double-sided electrode package 10C can be manufactured simply and at low cost without performing complex processing such as counterboring processing for the package substrate, laser processing for a number of through holes, etc.

In the present embodiment in particular, the step-like portion 36P is formed on one end side (basal portion of post) of each surface side terminal 36W, and the step-like portion 36P serves as the bonding pad for connecting the semiconductor chip 44. Therefore, the area for mounting the semiconductor chip 44 is spread up to near the surface side terminal 36W, and a larger semiconductor chip 44 can be mounted.

The present embodiment is similar to the first preferred embodiment even in the following points. (1) Redistribution wiring is enabled in arbitrary layouts at the surface of the double-sided electrode package 10C, and the connection to the package laminated on the upper side becomes very easy. (2) The surface prior to the redistribution wiring, of the double-sided electrode package 10C is covered with one kind of sealing resin, and hence the peeling-off of the resin is hard to occur and the moisture-resistance reliability is high. (3) The thin sealing resin layer 50 can easily be formed by grinding without using the advanced mold fabrication technique. (4) The electrode pads 18 and the surface side terminals 36W are arranged in plural rows and arranged in zigzags, whereby wiring is made easy and the numbers of the electrode pads 18 and the surface side terminals 36W can also be further increased.

Fourth Preferred Embodiment

One example of a POP module in which two double-sided electrode packages are laminated on each other and mounted on a motherboard is shown as a fourth preferred embodiment. Since the double-sided electrode packages are identical to the first preferred embodiment in configuration, the same reference numerals are respectively attached to the same constituent parts and their explanations are omitted.

[POP Module]

Figure 17:
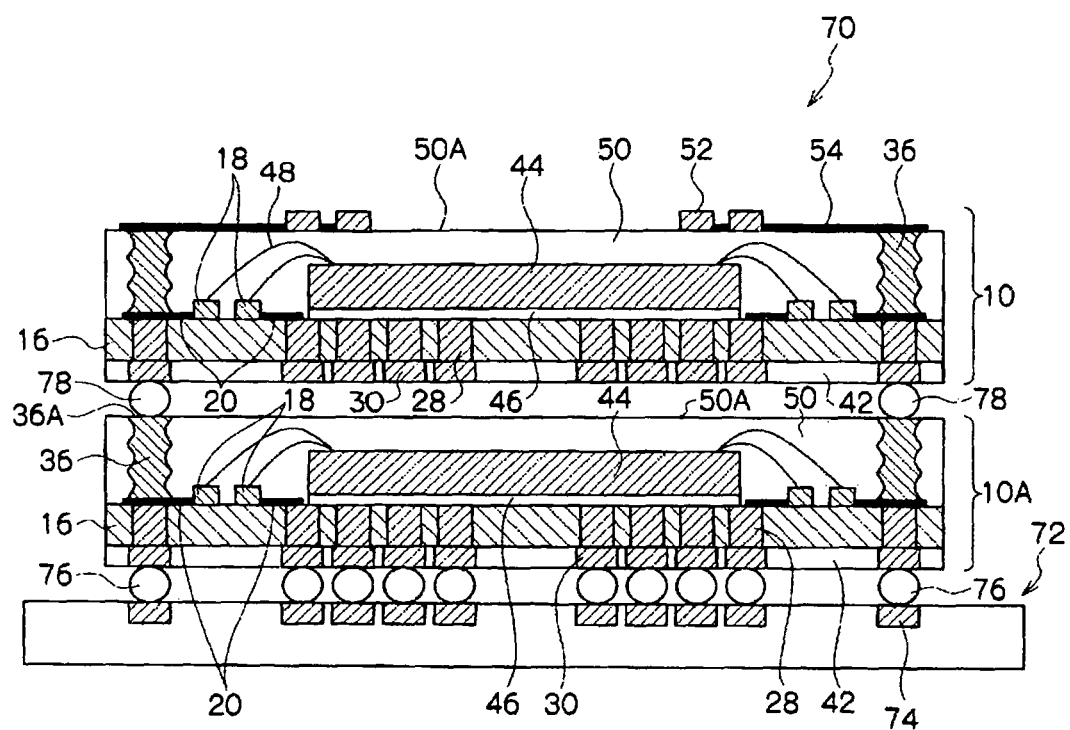
FIG. 17 is a schematic sectional view illustrating a configuration of a POP module according to a fourth preferred embodiment of the present invention.
Figure 18:
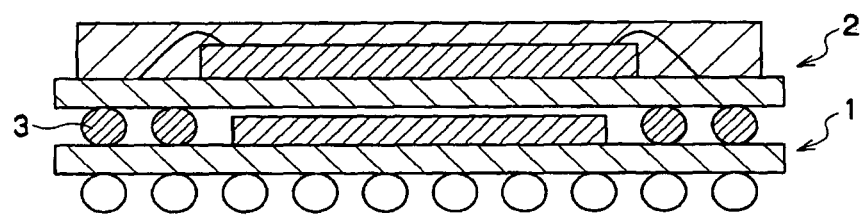
FIG. 18 is a schematic view showing a typical structure of a conventional POP.

FIG. 17 is a schematic sectional view showing a configuration of a POP module according to the four preferred embodiment of the present invention. The POP module 70 according to the fourth preferred embodiment comprises a motherboard 72, a double-sided electrode package 10A and a double-sided electrode package 10. As described in the first preferred embodiment, the package formed with the redistribution wiring pads 52 and wirings 54 corresponds to "double-sided electrode package 10", and the package prior to being formed with the redistribution wiring pads 52 and the wirings 54 corresponds to "double-sided electrode package 10A".

A plurality of connecting pads 74 are formed in the surface of the motherboard 72. The double-sided electrode package 10A is stacked on the motherboard 72. Lands 30 on the back surface side of the double-sided electrode package 10A are respectively electrically connected to the connecting pads 74 formed in the surface of the motherboard 72 via solder balls 76. Another double-sided electrode package 10 is stacked on the double-sided electrode package 10A. End faces 36A of surface side terminals 36 are exposed to the surface of the double-sided electrode package 10A. Lands 30 on the back surface side of the double-sided electrode package 10 are electrically connected to their corresponding end faces 36A exposed to the surface of the double-sided electrode package 10A via solder balls 78.

[Package Stacking Step]

The solder balls 76 are welded to their corresponding lands 30 on the back surface side of the double-sided electrode package 10A. Solder paste (not shown) is applied onto the end faces 36A exposed to the surface of the double-sided electrode package 10A to weld the solder balls 76 via the solder paste. Thus, the solder balls 76 and 78 are formed on the double-sided electrode package 10A as external terminals. The solder balls 76 of the double-sided electrode package 10A are pressure-welded to their corresponding connecting pads 74 formed in the surface of the motherboard 72. The solder balls 78 are pressure-welded to their corresponding lands 30 on the back surface side of the double-sided electrode package 10. Thus, the double-sided electrode package 10A and the double-sided electrode package 10 are mounted over the motherboard 72 to complete the POP module 70.

As described above, each of the double-sided electrode package 10 and the double-sided electrode package 10A has a structure in which the surface side terminals 36 provided with a plurality of protrusions at their side faces are formed on the substrate and the surface side terminals 36 are embedded in the corresponding sealing resin layer 50. Therefore, the adhesion between the surface side terminals 36 and a sealing resin is remarkably enhanced by an anchor effect. Warpage and peeling-off are hard to occur, and connection reliability and moisture-resistant reliability are excellent. Thus, in the present embodiment, the double-sided electrode package 10A is laminated on the double-sided electrode package 10A, whereby the POP module high in reliability can be configured.

Preferred Modifications

Modifications will be explained below.

Although each of the first through third preferred embodiments has described the example in which the redistribution wiring pads are formed on the surface of the double-sided electrode package, and the electrode pads are formed on the back surface of the double-sided electrode package, connecting terminals can further be formed on these pads. The double-sided electrode package may be configured as an LGA (Land Grid Array) type package by applying solder paste onto pads, for example. Alternatively, it may be configured as a BGA (Ball Grid Array) type package by providing solder balls provided on pads.

Although each of the first through third preferred embodiments has explained the example in which the package substrate is constituted by the flat plate-like core material made up of the insulator, the wirings, the through electrodes, the electrode pads and the solder resist, the package substrate can also be constituted of a multilayer-wired multilayer organic substrate or board. The multilayer organic substrate is equivalent to one in which wiring patterns are respectively formed in respective layers of a resin substrate made up of plural layers (e.g., two to four layers) and via holes for connecting the wiring patterns of the respective layers are formed as needed. Conductor layers are respectively formed into the via holes, and the conductor layers are respectively connected to lands corresponding to end face electrode portions formed on the lower surface sides of the conductor layers.

Although each of the first through third preferred embodiments has explained the example where one semiconductor chip is accommodated or held in one double-sided electrode package, a plurality of semiconductor chips can also be accommodated in one double-sided electrode package.

Although the semiconductor chip is wire bond-connected in each of the first through third preferred embodiments, the semiconductor chip may be flip-chip connected via bumps.

Although each of the first through third preferred embodiments has explained the example in which the post-like surface side terminals are formed, prismatic surface side terminals may be adopted. The outer peripheral shape of the cut cross-section obtained when the post-like surface side terminal is cut at the surface parallel to the surface of the substrate (core material) may be polygons such as circular forms such as a circle, an ellipse and an oblong, a tetragon (square, rectangle, parallelogram, rhombus), a pentagon, a hexagon, a heptagon, an octagon, etc.

Although the fourth preferred embodiment has explained the example in which the double-sided electrode package 10 and the double-sided electrode package 10A according to the first preferred embodiment constitute the POP module, the POP module can also be configured using the double-sided electrode package 10B (or package prior to the redistribution wiring) of the second preferred embodiment, and the double-sided electrode package 10C (or package prior to the redistribution wiring) of the third embodiment.

The through electrodes for electrically connecting the surface side of the double-sided electrode package and the back surface side thereof have heretofore been formed by charging the conductive material into the through holes. Therefore, the diameter of each through electrode is approximately constant, and the lower limit of its diameter has been limited by the diameter of each of the solder balls formed as the external terminals. On the other hand, since only the basal portion of each surface side terminal 36S is formed slender and the area of each end face 36A remains unchanged, the double-sided electrode package 10B according to the second preferred embodiment is adaptable to fine pitching of the substrate wirings by the multi-pin configuration of the semiconductor chip 44 without impairing connectivity to the package laminated at the upper side.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
   a package substrate having electrode pads formed on a first surface thereof for being respectively electrically connected to electrodes of a semiconductor chip, and having external connecting pads formed on a second surface thereof and being electrically connected to the electrode pads;
   said semiconductor chip placed on the first surface of the package substrate and having the electrodes thereof respectively electrically connected to the electrode pads of the package substrate;
   post-like surface side terminals each having a plurality of protrusions formed around a side face thereof, each end portion of each said post-like surface side terminal being of a diameter that gradually increases towards an end of the terminal corresponding to the end portion, one end of each said surface side terminal being electrically connected to the electrode pads of the package substrate, each said post-like surface side terminal being of a height that is between twice and three times of a thickness of said semiconductor chip; and
   a sealing resin layer sealing the semiconductor chip and surrounding the surface side terminals from the side faces thereof, such that the other end of each surface side terminal is exposed from a surface of the sealing resin layer.

2. The semiconductor device according to claim 1, wherein the surface side terminals are vertical to the first surface of the package substrate.

3. The semiconductor device according to claim 1, wherein the surface side terminals are cylindrical or conical.

4. The semiconductor device according to claim 1, wherein the surface side terminals are formed by etching a metal film laminated over the package substrate plural times each time removing a portion of the metal film from a top thereof.

5. The semiconductor device according to claim 1, wherein the protrusions of the surface side terminals are formed by side etching the metal film during the etching of the metal film.

6. The semiconductor device according to claim 1, further including:
   redistribution wiring pads formed on the surface of the sealing resin layer, and
   connecting wirings formed on the surface of the sealing resin layer and electrically connecting the other ends of the surface side terminals and the redistribution wiring pads.

* * * * *